United States Patent
Zhou et al.

(10) Patent No.: US 10,510,982 B2
(45) Date of Patent: Dec. 17, 2019

(54) DISPLAY SUBSTRATE, METHOD FOR FABRICATING THE SAME, AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Zhenli Zhou, Beijing (CN); Zhiliang Jiang, Beijing (CN); Yinan Liang, Beijing (CN)

(73) Assignees: BOE TECHNOLOGY GROUP CO., LTD., Beijing (CN); CHENGDU BOE OPTOELECTRONICS TECHNOLOGY CO. LTD., Sichuan (CN)

(*) Notice: Subject to any disclaimer, the term of this patent is extended or adjusted under 35 U.S.C. 154(b) by 0 days.

(21) Appl. No.: 15/778,773

(22) PCT Filed: Jun. 30, 2017

(86) PCT No.: PCT/CN2017/091180
§ 371 (c)(1),
(2) Date: May 24, 2018

(87) PCT Pub. No.: WO2018/045801
PCT Pub. Date: Mar. 15, 2018

(65) Prior Publication Data
US 2018/0342695 A1 Nov. 29, 2018

(30) Foreign Application Priority Data
Sep. 9, 2016 (CN) .......................... 2016 1 0816073

(51) Int. Cl.
*H01L 51/52* (2006.01)
*H01L 51/56* (2006.01)
(Continued)

(52) U.S. Cl.
CPC .......... *H01L 51/5246* (2013.01); *C03C 27/06* (2013.01); *H01L 51/524* (2013.01);
(Continued)

(58) Field of Classification Search
CPC . H01L 51/5246; H01L 51/52; H01L 51/5253; H01L 51/56; H01L 21/77;
(Continued)

(56) References Cited

U.S. PATENT DOCUMENTS

2005/0285522 A1* 12/2005 Han ........................ H05B 33/04
313/512
2012/0181522 A1* 7/2012 Yamazaki ........... H01L 27/3211
257/40
(Continued)

FOREIGN PATENT DOCUMENTS

| CN | 101196635 A | 6/2008 |
| CN | 103337511 A | 10/2013 |

(Continued)

OTHER PUBLICATIONS

First Office Action for Chinese Patent Application No. 201610816073.7 dated Mar. 2, 2018.
(Continued)

*Primary Examiner* — Sitaramarao S Yechuri
(74) *Attorney, Agent, or Firm* — Calfee, Halter & Griswold LLP

(57) ABSTRACT

A display substrate, a method for fabricating the same, and a display apparatus are disclosed. The display substrate is provided with functional films, at least one of the functional films includes a protrusion array on a side away from the display substrate. When the display substrate is assembled with another display substrate, protrusion portions of the protrusion array are embedded into a frame sealant between the display substrate and the another display substrate.

13 Claims, 11 Drawing Sheets

(51) Int. Cl.
*C03C 27/06* (2006.01)
*C03C 8/24* (2006.01)
*H01L 27/32* (2006.01)

(52) U.S. Cl.
CPC .......... *H01L 51/5253* (2013.01); *H01L 51/56* (2013.01); *C03C 8/24* (2013.01); *H01L 27/3258* (2013.01); *H01L 51/525* (2013.01); *H01L 2251/53* (2013.01)

(58) Field of Classification Search
CPC ..... H01L 2251/53; C03C 27/06; C03C 27/32; C03C 27/3258; C03C 8/24
See application file for complete search history.

(56) References Cited

U.S. PATENT DOCUMENTS

| | | | |
|---|---|---|---|
| 2013/0043785 A1* | 2/2013 | Nakamura | H01L 27/3223 313/504 |
| 2013/0175710 A1* | 7/2013 | Sakakura | H01L 51/5237 257/787 |
| 2013/0264566 A1* | 10/2013 | Umezaki | G09G 3/342 257/43 |
| 2014/0139985 A1* | 5/2014 | Shih | H05K 5/063 361/679.01 |
| 2015/0008819 A1 | 1/2015 | Yu | |
| 2015/0221708 A1* | 8/2015 | Go | H01L 51/5246 257/40 |
| 2015/0372253 A1* | 12/2015 | Hong | H01L 51/524 257/40 |
| 2016/0293883 A1* | 10/2016 | Hong | H01L 27/3258 |
| 2017/0117502 A1* | 4/2017 | Park | H01L 27/3258 |
| 2018/0342696 A1* | 11/2018 | Hong | H01L 27/3258 |

FOREIGN PATENT DOCUMENTS

| | | |
|---|---|---|
| CN | 104090428 A | 10/2014 |
| CN | 106356392 A | 1/2017 |

OTHER PUBLICATIONS

Search Report and Written Opinion for International Application No. PCT/CN2017/091180 dated Oct. 11, 2017.

* cited by examiner

DISPLAY SUBSTRATE, METHOD FOR FABRICATING THE SAME, AND DISPLAY APPARATUS

RELATED APPLICATIONS

The present application is the U.S. national phase entry of PCT/CN2017/091180, with an international filing date of Jun. 30, 2017, which claims the benefit of Chinese Patent Application No. 201610816073.7, filed on Sep. 9, 2016, the entire disclosures of which are incorporated herein by reference.

TECHNICAL FIELD

The present disclosure relates to the field of display technologies, and particularly to a display substrate, a method for fabricating the same, and a display apparatus.

BACKGROUND

With the development of technologies, an organic light emitting display (OLED) has been applied widely in the daily life. In a flat display and flat light source technologies, it is an important technique to bond two flat glass plates, and the packaging effect directly affects the device performance. This makes it more important to control the packaging quality of OLED.

Generally, an OLED is packaged by bonding two substrates with a frame sealant. The case in which an OLED packaged by Frit packaging technique is described. In this case, a Frit material is formed into a solution with a certain viscosity. The solution is coated on a glass substrate, and is heated to remove the solvent. Then the glass substrate is boned to a glass substrate to be packaged, and the Frit material is burned instantaneously to melt by laser, so that these two glass substrates are bonded together. In Frit packaging technique, an inorganic packaging medium is adopted, so that it has strong ability to block water and oxygen. This technique is especially suitable for fabricating OLED which is sensitive to water and oxygen.

In case the glass substrate and the substrate to be packaged are packaged by a frame sealant in the display device, a problem arises in which the display device is eroded by water and oxygen due to the possibility of detaching and cracking of the frame sealant.

SUMMARY

Embodiments of the present disclosure provide an improved display substrate, a method for fabricating the same, and a display apparatus, to alleviate or solve one or more of the above problems or other problems.

In a first aspect, embodiments of the present disclosure provide a display substrate, display substrate is provided with functional films, at least one of the functional films comprises a protrusion array on a side away from the display substrate, wherein when the display substrate is assembled with another display substrate, at least one protrusion portions of the protrusion array are embedded into a frame sealant between the display substrate and another display substrate.

For example, the protrusion array comprises protrusion sub-arrays, each of the protrusion sub-arrays comprises a flat portion, and the at least one protrusion portions are arranged on the flat portion.

For example, the functional films comprise a first functional film and a second functional film; the first functional film contacts the display substrate on a side, and contacts a side of the second functional film on the other side; the second functional film comprises the protrusion array on a side away from the display substrate; and the flat portion and the at least one protrusion portions are arranged on the first functional film.

For example, the first functional film comprises the protrusion array on a side away from the display substrate.

For example, the functional films further comprise a third functional film; the third functional film covers the flat portion, and a thickness of the third functional film is smaller than a thickness of the protrusion portions; and the third functional film is provided with at least one via holes, and a top of the at least one protrusion portions pass through the via holes.

For example, the functional films further comprise a third functional film, and the third functional film covers the flat portion and the protrusion portions on the flat portion.

For example, the third functional film comprises a portion which contacts the first functional film.

For example, at least one of the functional films comprises recessed regions and non-recessed regions, and the protrusion array is located in the non-recessed regions.

For example, the protrusion portions have a cross-section in a plane parallel with the display substrate and the cross-section has a shape of circle, triangle, rectangle or polygon.

For example, a top of the protrusion portions is a curved surface.

For example, the flat portion and the at least one protrusion portions comprise a metal.

For example, the first functional film is a buffer layer comprising SiNx or SiO$_2$.

For example, the second functional film is a metal layer.

For example, the third functional film is an insulating layer comprising SiNx or SiO$_2$.

In a second aspect, embodiments of the present disclosure provide a method for fabricating a display substrate, comprising:

forming at least one of the functional films on a display substrate; and forming a protrusion array on a side of at least one of the functional films away from the display substrate, wherein protrusion portions of the protrusion array are configured to be embedded into a frame sealant between the display substrate and another display substrate, during assembling the display substrate with the another display substrate.

For example, forming at least one of the functional films on the display substrate comprises:

forming a first functional film on the display substrate by deposition;

coating a first photoresist layer on the first functional film, and performing a first exposure and development to form a pattern comprising recessed regions and non-recessed regions on the first photoresist layer; and etching the display substrate on which the first exposure and development has been performed, to form the recessed regions and non-recessed regions on the first functional film, and lifting off the first photoresist layer.

For example, forming the protrusion array on the side of at least one of the functional films away from the display substrate comprises:

forming a first functional film;

forming a first material layer by deposition on the display substrate on which the first functional film has been formed;

coating a second photoresist layer to cover the first material layer, and performing a second exposure and development, to form a pattern comprising the flat portion on the second photoresist layer at a position to which the non-recessed regions of the first functional film correspond;

etching the display substrate on which the second exposure and development has been performed, to form the flat portion on the first material layer, and lifting off the second photoresist layer;

forming a third material layer by deposition on the display substrate on which the flat portion has been formed;

coating a third photoresist layer which covers the third material layer, and performing a third exposure and development, to form a pattern comprising the third functional film on the third photoresist layer at a position to which the flat portion corresponds;

etching the display substrate on which the third exposure and development has been performed, to form the third functional film, and lifting off the third photoresist layer, wherein the third functional film covers the flat portion;

coating a fourth photoresist layer which covers the third functional film, and performing a fourth exposure and development, to form a pattern comprising via holes on the fourth photoresist layer;

etching the display substrate on which the fourth exposure and development has been performed, to form the via holes on the third functional film;

forming a second material layer on the display substrate on which the via holes have been formed, the second material layer is connected with the flat portion through the via holes;

coating a fifth photoresist layer which covers the second material layer, and performing a fifth exposure and development, to retain photoresist on the fifth photoresist layer to which the protrusion portions correspond; and etching the display substrate on which the fifth exposure and development has been performed, to form the protrusion portions on the second material layer, and lifting off the fourth photoresist layer and the fifth photoresist layer, to form a second functional film which comprises the flat portion and the protrusion portions on the flat portion.

For example, the photoresist which is retained on the fifth photoresist layer and to which the protrusion portions correspond has a same shape as a top of the protrusion portions.

For example, in case the top of the protrusion portions is a curved surface which acts to reflect curing light.

For example, forming the protrusion array on the side of at least one of the functional films away from the display substrate comprises:

forming a first functional film;

forming a first material layer by deposition on the display substrate on which the first functional film has been formed;

coating a second photoresist layer which covers the first material layer, and performing a second exposure and development, to form a pattern comprising the flat portion on the second photoresist layer at a position the non-recessed regions of the first functional film correspond;

etching the display substrate on which the second exposure and development has been performed, to form the flat portion on the first material layer, and lifting off the second photoresist layer;

coating a third photoresist layer which covers the flat portion, and performing a third exposure and development, to form a pattern comprising via holes on the third photoresist layer at a position the protrusion portions of the flat portion corresponds;

depositing on the display substrate on which the third exposure and development has been performed, to form a second material layer on the third photoresist layer, wherein the second material layer is connected with the flat portion through the via holes;

coating a fourth photoresist layer which covers the second material layer, and performing a fourth exposure and development, to retain the photoresist on the fourth photoresist layer to which the protrusion portions correspond;

etching the display substrate on which the fourth exposure and development has been performed, to form the protrusion portions on the second material layer, and lifting off the third photoresist layer and the fourth photoresist layer, to form a second functional film which comprises the flat portion and the protrusion portions on the flat portion;

depositing on the display substrate on which the fourth exposure and development has been performed, to form a third material layer which covers the second functional film;

coating a fifth photoresist layer which covers the third material layer, and performing a fifth exposure and development, to form a pattern comprising the third functional film on the fifth photoresist layer; and etching the display substrate on which the fifth exposure and development has been performed, to form the third functional film on the third material layer, and lifting off the fifth photoresist layer.

For example, the photoresist which is retained on the fourth photoresist layer and to which the protrusion portions correspond has a same shape as a top of the protrusion portions.

For example, the top of the protrusion portions is a curved surface which acts to reflect curing light.

In a third aspect, embodiments of the present disclosure provide a display apparatus, comprising the display substrate in the first aspect.

BRIEF DESCRIPTION OF THE DRAWINGS

In order to explain the technical solutions in the embodiments of the present disclosure or the prior art more clearly, the drawings to be used in the description of the embodiments or the prior art will be introduced briefly in the following, apparently, the drawings described below are only some embodiments of the present disclosure, the person with ordinary skill in the art, on the premise of not paying any creative work, can also obtain other drawings from these drawings.

DETAILED DESCRIPTION OF EMBODIMENTS

Figure 1:
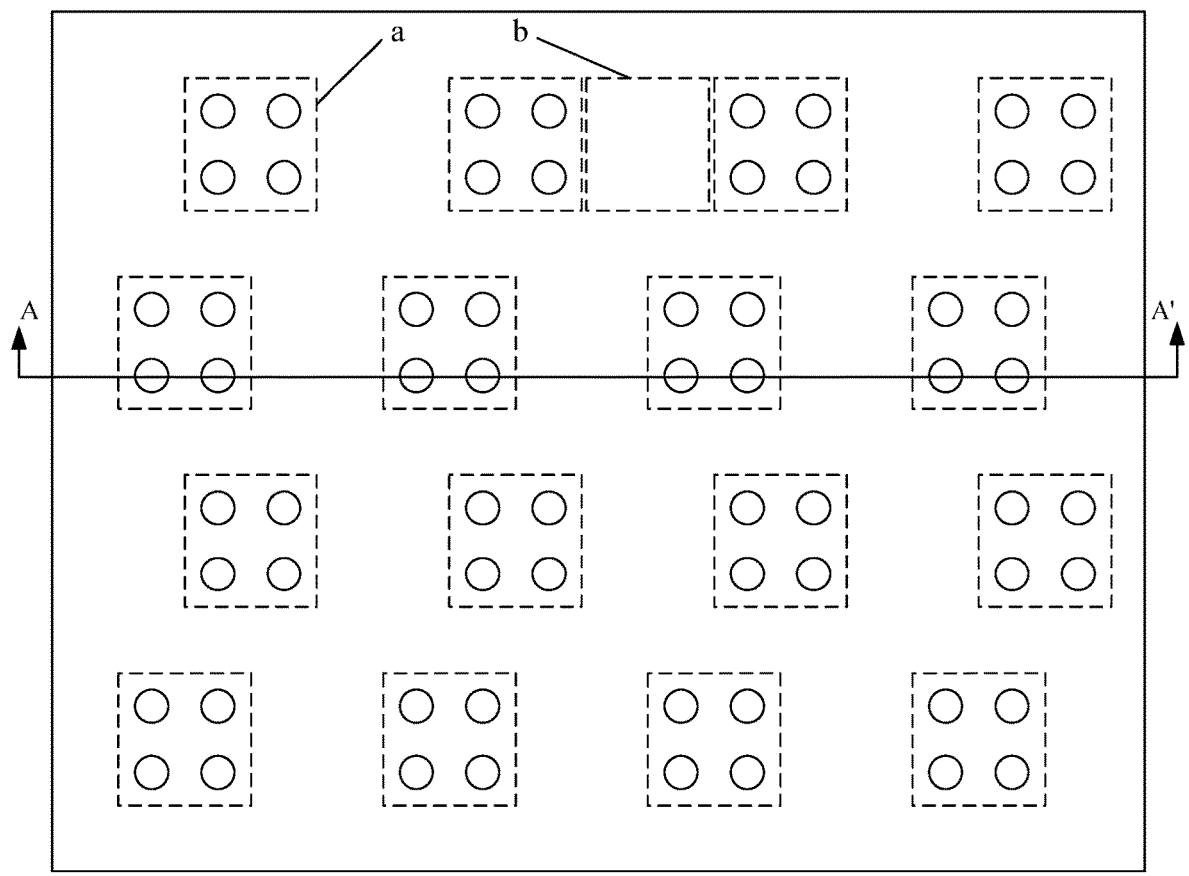
FIG. 1 is a partial perspective structural view for illustrating Frit.

The display substrate, the method for fabricating the same, the display panel, and the display apparatus in embodiments of the present disclosure will be described in detail hereinafter with reference to the accompanying drawing.

Reference numerals: 1 glass substrate; 10 display substrate; 2 glass substrate to be packaged; 20 another display substrate; 3 buffer layer; 30 first functional film; 4 metal layer; 40 second functional film; 4010 protrusion array; 4011 flat portion; 4012 third functional film; 4013 via holes; 4014 protrusion portions; 4015 first material layer; 4016 second material layer; 4017 third material layer; 5 insulating layer; 50 frame sealant; 6 Frit material; 6011 first photoresist layer; 6012 second photoresist layer; 6013 third photoresist layer; 6014 fourth photoresist layer; 6015 fifth photoresist layer; a recessed regions; b non-recessed regions.

Figure 2:
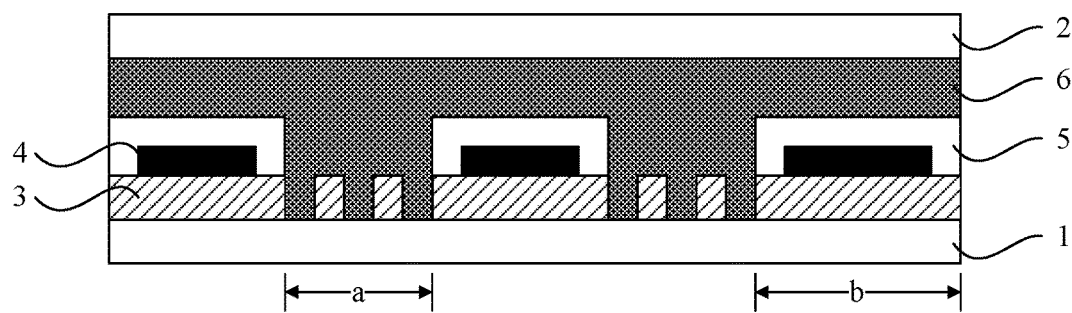
FIG. 2 is a cross-sectional view along a line A-A' in FIG. 1.

FIG. 1 and FIG. 2 show schematic views of Frit. The cross-sectional view of Frit along a line A-A' in FIG. 1 is shown in FIG. 2. As shown in FIG. 2, a buffer layer 3 of a glass substrate 1 is provided with recessed regions a and non-recessed regions b. A metal layer 4 and an insulating layer 5 are arranged in the non-recessed regions b. The glass substrate 1 and a glass substrate to be packaged 2 are bonded together by a Frit material 6. Although the buffer layer 3 on the glass substrate 1 is provided the recessed regions a, OLED display devices which are Not Good (NG) are analyzed in a reliability test for Frit packaging technique of OLED display devices, and it has been found that air leakage in most of the packaged OLED display devices results from the displacement, detachment and cracking of Frit material in the non-recessed regions b. Researches have revealed that surfaces of the non-recessed regions b are parallel with contact surfaces between the non-recessed regions b and the Frit material 6, and the bonding with the Frit material 6 only realizes bonding in the horizontal direction. In case the Frit material 6 is not completely cured, the contact surface in the non-recessed regions b is prone to displacement under the effect of external environment. This results in detaching and cracking of the Frit material 6 on surfaces of the non-recessed regions b, so that OLED display devices are eroded by water and oxygen.

In the display substrate in embodiments of the present disclosure, a display substrate is provided with functional films, at least one of the functional films comprises a protrusion array on a side away from the display substrate, and protrusion portions of the protrusion array are embedded in a frame sealant. When the display substrate is bonded with another display substrate by the frame sealant, the protrusion portions of the protrusion array are embedded in the frame sealant. This increases an acting force for preventing a displacement between the side of functional films away from the display substrate and the contact surface of the frame sealant, and thus increases the fixing effect in the parallel direction. This blocks displacement between the side of functional films away from the display substrate and the contact surface of the frame sealant, reduces the possibility of detaching and cracking of the frame sealant due to displacement, and solves the problem of erosion of the display device by water and oxygen due to detaching and cracking of the frame sealant. In addition, since at least one of the functional films is provided with the protrusion array on the side away from the display substrate, and the protrusion array is embedded in the frame sealant, this increases a contact surface area between the side of functional films away from the display substrate and the frame sealant, increases a bonding strength between the side of functional films away from the display substrate and the frame sealant, and thus increases the bonding strength of the frame sealant between the display substrate and the another display substrate.

Figure 3:
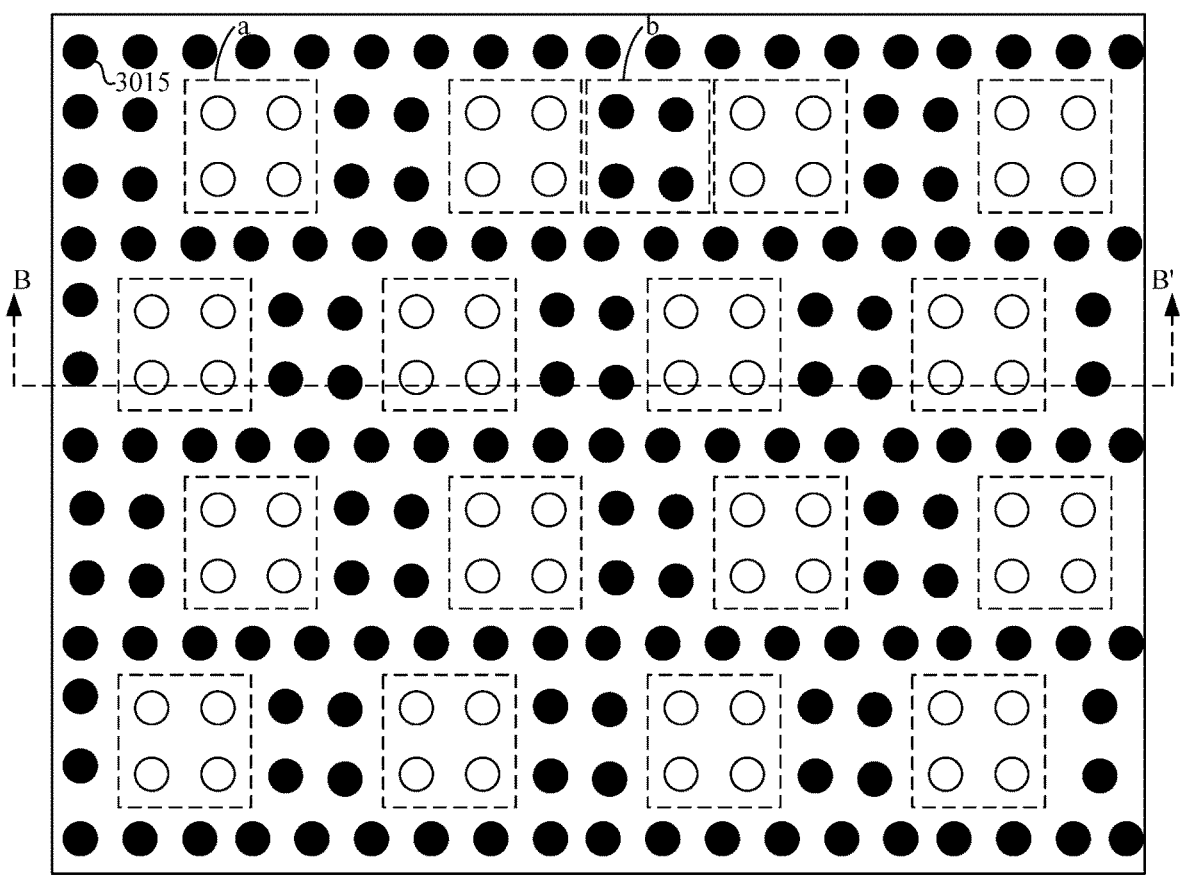
FIG. 3 is a perspective structural view for illustrating a specific display substrate of a display device in an embodiment of the present disclosure.
Figure 4:
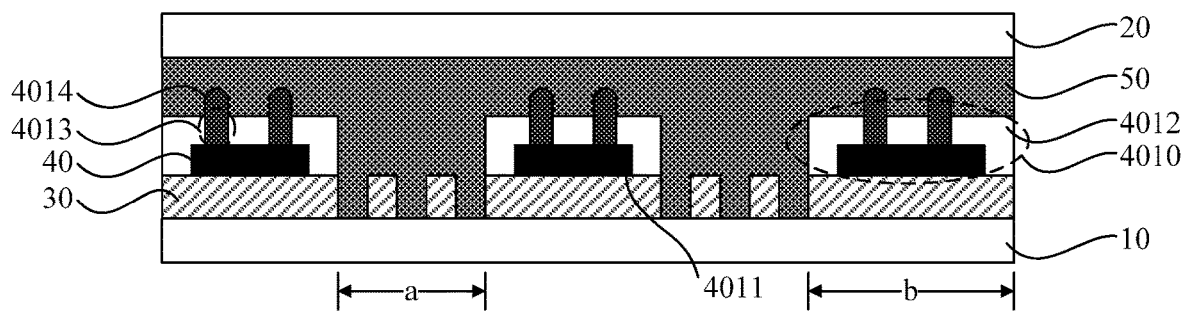
FIG. 4 is a cross-sectional view along a line B-B' of a display substrate of the display device shown in FIG. 3 in an embodiment of the present disclosure.

In an embodiment, a display substrate is provided. As shown in FIGS. 3 and 4, a display substrate 10 is provided with functional films. At least one of the functional films comprises a protrusion array 4010 on a side away from the display substrate 10. When the display substrate 10 is assembled with another display substrate 20, protrusion portions of the protrusion array 4010 are embedded in a frame sealant 50 between the display substrate 10 and another display substrate 20.

A cross-sectional view along a line B-B' in the display substrate of FIG. 3 is shown in FIG. 4. As shown in FIG. 4, the display substrate is provided with functional films, at least one of the functional films comprises a protrusion array on a side away from the display substrate, and protrusion portions of the protrusion array are embedded in a frame sealant. When the display substrate is bonded with another display substrate by the frame sealant, since protrusion portions of the protrusion array are embedded in the frame sealant, this increases an acting force for preventing a displacement between the side of functional films away from the display substrate and the contact surface of the frame sealant, and thus increases the fixing effect in the parallel direction. This blocks displacement between the side of functional films away from the display substrate and the contact surface of the frame sealant, reduces the possibility of detaching and cracking of the frame sealant due to displacement, and solves the problem of erosion of the display device by water and oxygen due to detaching and cracking of the frame sealant. In addition, since at least one of the functional films is provided with the protrusion array on the side away from the display substrate, and the protrusion array is embedded in the frame sealant, this increases a contact surface area between the side of functional films away from the display substrate and the frame sealant, increases a bonding strength between the side of functional films away from the display substrate and the frame sealant, and thus increases the bonding strength of the frame sealant between the display substrate and the another display substrate.

Figure 6:
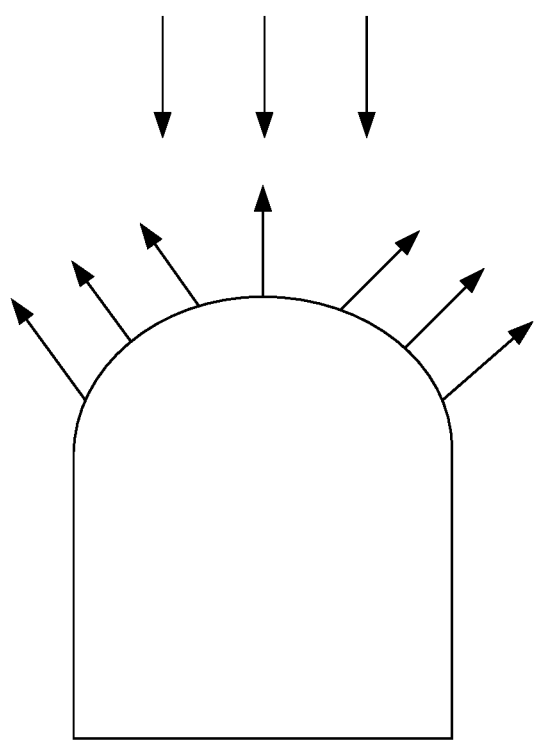
FIG. 6 is a schematic view for illustrating a top of protrusion portions of a display substrate in an embodiment of the present disclosure.

In an embodiment, a display substrate is provided. As shown in FIG. 3, FIG. 4, and FIG. 6, the protrusion array 4010 comprises protrusion sub-arrays. Each of the protrusion sub-arrays comprises a flat portion 4011 and at least one protrusion portions 4014 on the flat portion.

For example, the functional films comprise a first functional film 30 and a second functional film 40. A side of the first functional film 30 contacts the display substrate 10, and the other side of the first functional film 30 contacts a side of the second functional film 40. The second functional film 40 comprises the protrusion array 4010. The second functional film 40 comprises the protrusion array 4010 on a side away from the display substrate 10. The flat portion 4011 and at least one protrusion portions 4014 are arranged on the first functional film 30.

For example, the first functional film 30 is provided with the protrusion array 4010 on a side away from the display substrate 10.

For example, the functional films further comprise a third functional film 4012. The third functional film 4012 covers the flat portion 4011, and the third functional film 4012 has a thickness smaller than that of the protrusion portions 4014. The third functional film 4012 is provided with at least one the via holes 4013, and a top of the at least one protrusion portions 4014 passes through the via holes 4013.

It is noted that the top of the protrusion portions can be embedded in the frame sealant.

For example, the third functional film 4012 comprises a portion which contacts the first functional film 30.

For example, at least one of the functional films comprises recessed regions a and non-recessed regions b, and the protrusion array 4010 is located in the non-recessed regions b.

For example, a cross-section of the protrusion portions 4014 in a plane parallel with the display substrate has a shape of circle, triangle, rectangle or polygon. A top of the protrusion portions 4014 is a curved surface.

For example, the flat portion 4011 and at least one protrusion portions 4014 are metal. It is noted that the flat portion and the at least one protrusion portions can be made from Mo.

For example, the first functional film 30 is a buffer layer which comprises $SiN_x$ or $SiO_2$.

For example, the second functional film 40 is a metal layer.

For example, the third functional film 4012 is an insulating layer which comprises $SiN_x$ or $SiO_2$.

It is noted that, in a practical fabricating process, if the second functional film is directly arranged on the display substrate, the fixing effect of the second functional film on the display substrate is not sufficient. Thus, it is required to arrange the first functional film on the display substrate in advance. Since the bonding between the first functional film and the display substrate is strong, and the bonding between the metal layer and the first functional film is also strong, the product can be fixed firmly and the stability is increased.

As shown in FIG. 4, the protrusion array comprises several protrusion sub-arrays. Each of the protrusion sub-arrays comprises a flat portion and at least one protrusion portions on the flat portion. The third functional film and the first functional film comprise at least one of $SiN_x$ or $SiO_2$. The at least one protrusion portions pass through via holes in the third functional film, and the top of the at least one protrusion portions is embedded in the frame sealant. The flat portion and the at least one protrusion portions comprise a metal. A cross-section of the protrusion portions in a plane parallel with the display substrate is formed into a shape as needed, e.g., a circle.

As shown in FIG. 6, the top of the protrusion portions is a curved surface. During sealing with laser, the top of the protrusion portions reflects laser light. A device for emitting laser light is generally located above the first substrate. The frame sealant around the protrusion portions not only receives laser light in the vertical direction, but also receives laser light reflected by the curved surface. As a result, the frame sealant around the protrusion portions receives more laser light within a same duration of time, and thus receives more energy. This facilitates melting the frame sealant.

It is noted that, protrusion sub-arrays at least can comprise one protrusion portion. As shown in FIG. 3, the recessed regions are arranged in an array, and the protrusion array are arranged to surround the recessed regions.

Figure 5:
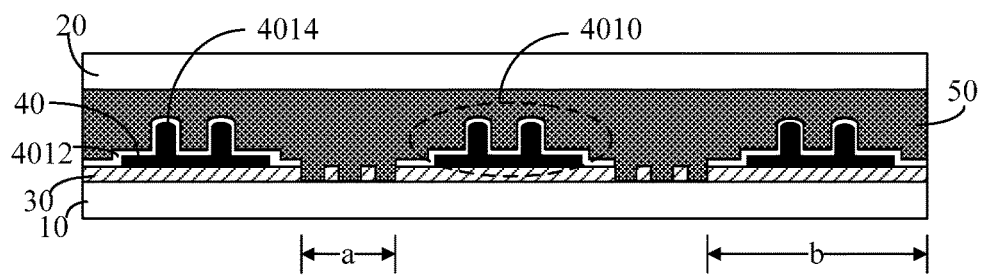
FIG. 5 is a cross-sectional view along a line B-B' of another display substrate of the display device shown in FIG. 3 in an embodiment of the present disclosure.

In an embodiment, a display substrate is provided. As shown in FIG. 3, FIG. 5 and FIG. 6, the protrusion array 4010 comprises protrusion sub-arrays, and each of the protrusion sub-arrays comprises the flat portion 4011 and at least one protrusion portions 4014.

For example, the functional films comprise the first functional film 30 and the second functional film 40. The first functional film 30 contacts the display substrate 10 on a side, and contacts a side of the second functional film 40 on the other side. The second functional film 40 comprises the protrusion array 4010. The second functional film 40 comprises the protrusion array 4010 on a side away from the display substrate 10. The flat portion 4011 and at least one protrusion portions 4014 are arranged on the first functional film 30.

For example, the first functional film 30 is provided with the protrusion array 4010 on a side away from the display substrate 10.

For example, the functional films further comprise the third functional film 4012. The third functional film 4012 covers the flat portion 4011, and the third functional film 4012 has a thickness smaller than that of the protrusion portions 4014. The embodiment shown in FIG. 5 differs from the embodiment shown in FIG. 4 in that the third functional film 4012 covers the protrusion array 4010 in a conformal manner, i.e., covers the flat portion 4011 and the protrusion portions 4014.

For example, the third functional film 4012 comprises a portion which contacts the first functional film 30.

For example, at least one of the functional films comprises recessed regions a and non-recessed regions b, and the protrusion array 4010 is located in the non-recessed regions b.

For example, a cross-section of the protrusion portions 4014 in a plane parallel with the display substrate has a shape of circle, triangle, rectangle or polygon. A top of the protrusion portions 4014 is a curved surface.

For example, the flat portion 4011 and at least one protrusion portions 4014 are a metal. It is noted that the flat portion and the at least one protrusion portions for example is made from Mo.

For example, the first functional film 30 is a buffer layer which comprises $SiN_x$ or $SiO_2$.

For example, the second functional film 40 is a metal layer.

For example, the third functional film 4012 is an insulating layer. For example, the insulating layer comprises $SiN_x$ or $SiO_2$.

It is noted that, in a practical fabricating process, if the second functional film is directly arranged on the display substrate, the fixing effect of the second functional film on the display substrate is not sufficient. Thus, it is required to arrange the first functional film on the display substrate in advance. Since the bonding between the first functional film and the display substrate is strong, and the bonding between the metal layer and the first functional film is also strong, the product can be fixed firmly and the stability is increased.

As shown in FIG. 5, the protrusion array comprises several protrusion sub-arrays, and each of the protrusion sub-arrays comprises a flat portion and at least one protrusion portions on the flat portion. The third functional film and the first functional film comprise at least one of $SiN_x$ or $SiO_2$. The third functional film is arranged on the first functional film, and covers the flat portion and the protrusion portions on the flat portion. The flat portion and the at least one protrusion portions comprise a metal. A cross-section of the protrusion portions is formed to a shape as needed.

It is noted that protrusion sub-arrays at least can comprise one protrusion portion. As shown in FIG. 3, the recessed regions are arranged in an array, and the protrusion array are arranged to surround the recessed regions.

In this embodiment, the protrusions which are embedded in the frame sealant are the protrusion portions and the third functional film covering the protrusion portions. The third functional film covers the flat portion and the protrusion portions on the flat portion. The protrusion portions on the flat portion and the third functional film on the protrusion portions form the protrusion portions of the protrusion array, and the protrusion portions are embedded in the frame sealant. When the display substrate is bonded with another display substrate by the frame sealant, the protrusion portions are embedded in the frame sealant. This increases an acting force for preventing a displacement between the surface of the third functional film and the contact surface of the third functional film and the frame sealant, thus increases the fixing effect in the parallel direction, and blocks the displacement between the third functional film and the contact surface of the frame sealant. This reduces the possibility of detaching and cracking of the frame sealant due to displacement, and solves the problem of erosion of the display device by water and oxygen due to detaching and cracking of the frame sealant. In addition, the protrusion array is arranged on a side of the third functional film, and the protrusion portions of the protrusion array and the third functional film covering the protrusion portions are embedded in the frame sealant. This increases the contact surface area between the surface of the third functional film and the frame sealant, increases the bonding strength between the third functional film surface and the frame sealant, and thus increases the bonding strength of the frame sealant between the display substrate and the another display substrate.

In an embodiment, a method for fabricating a display substrate is provided, which for example comprises the following steps.

Step S101, forming at least one functional films on the display substrate 10;

Step S102, forming the protrusion array 4010 on a side of at least one of the functional films away from the display substrate 10. When the display substrate 10 is assembled with another display substrate 20, protrusion portions of the protrusion array 4010 are embedded in the frame sealant 50 between the display substrate 10 and another display substrate 20.

As can be seen from the foregoing, during forming the display substrate, functional films are firstly formed on the display substrate, and the protrusion array is formed on the side of functional films away from the display substrate. A frame sealant is then coated on the display substrate, and the display substrate is bonded with another display substrate by laser sealing. The frame sealant is bonded with the display substrate on the side of the functional films away from the display substrate. Since the protrusion portions of the protrusion array formed on the side of functional films away from the display substrate are embedded in the frame sealant, an acting force can be developed in a direction perpendicular with the side of functional films away from the display substrate and the contact surface of the frame sealant. Generally, the side of functional films away from the display substrate is parallel with the contact surface of the frame sealant, and the resulting acting force only lies in the horizontal direction. After curing frame sealant, there may be displacement between the side of functional films away from the display substrate and the contact surface of the frame sealant under the effect of external environment, so that the surface of the frame sealant in the non-recessed regions suffers from detaching and cracking. According to the present disclosure, the protrusion array is formed in the non-recessed regions of the first functional film, so that when the display substrate is bonded with another display substrate by the frame sealant, an acting force is formed not only in the horizontal direction. Since the protrusion array is embedded in the frame sealant, an acting force for preventing a displacement between the side of functional films away from the display substrate and the contact surface of the frame sealant is developed, and thus this increases the fixing effect in the parallel direction. This blocks displacement between the side of functional films away from the display substrate and the contact surface of the frame sealant, reduces the possibility of detaching and cracking of the frame sealant due to displacement, and solves the problem of erosion of the display device by water and oxygen due to detaching and cracking of the frame sealant. In addition, since the protrusion array is formed on the side of functional films away from the display substrate, and protrusion portions of the protrusion array are embedded in a frame sealant, this increases a contact surface area between the side of functional films away from the display substrate and the frame sealant, increases a bonding strength between the side of functional films away from the display substrate and the frame sealant, and thus increases the bonding strength of the frame sealant between the display substrate and the another display substrate.

Figure 7:
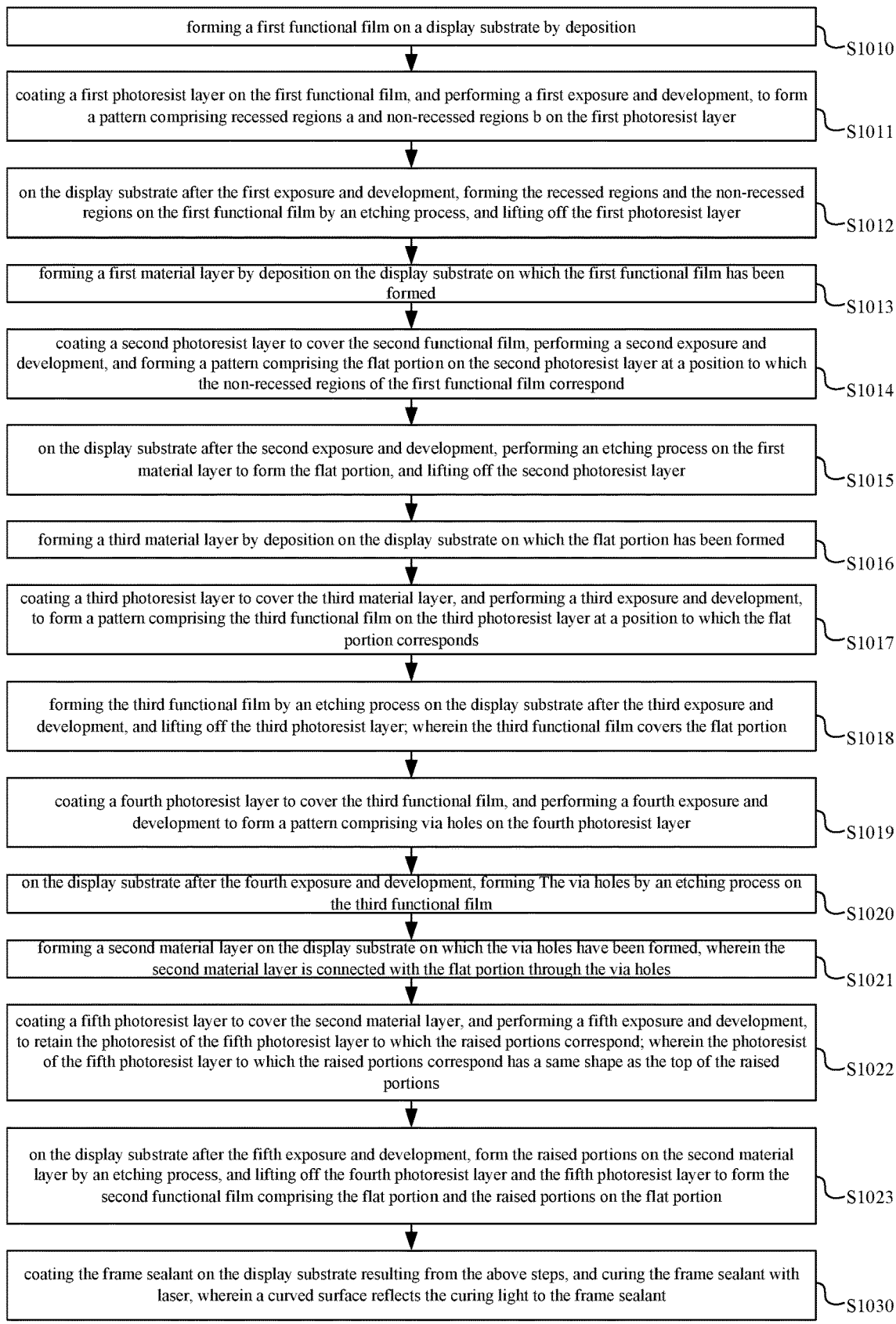
FIG. 7 is a flow chart for illustrating a method for fabricating a display substrate in an embodiment of the present disclosure.
Figure 8A:
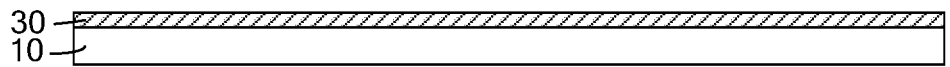
FIGS. 8a, 8b, 8c, 8d, 8e, 8f, 8g, 8h, 8i, 8j, 8k, 8l, 8m, 8n, 8o and 8p are structural views for illustrating a display substrate during a fabricating process in an embodiment of the present disclosure.
Figure 8B:
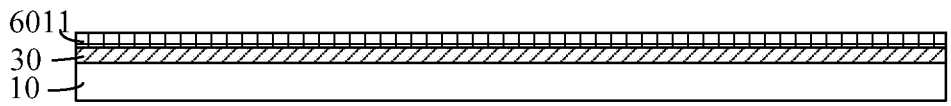
Figure 8C:
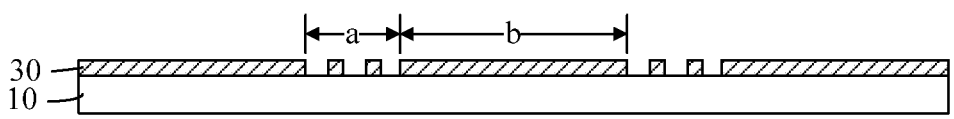
Figure 8D:
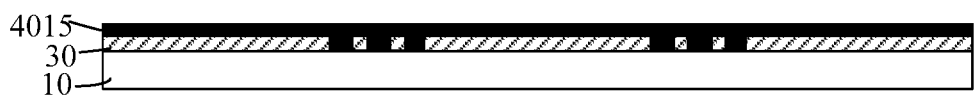
Figure 8E:
Figure 8F:
Figure 8G:
Figure 8H:
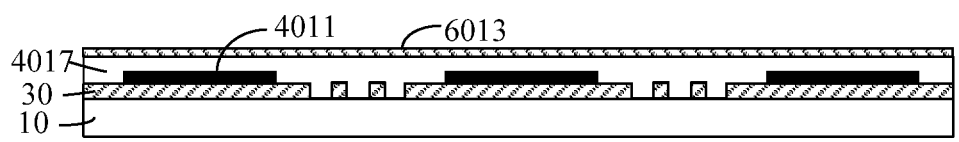
Figure 8I:
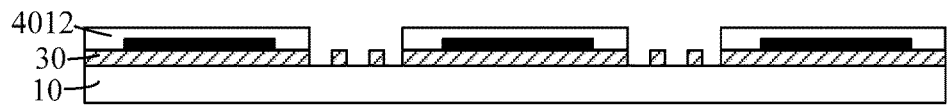
Figure 8J:
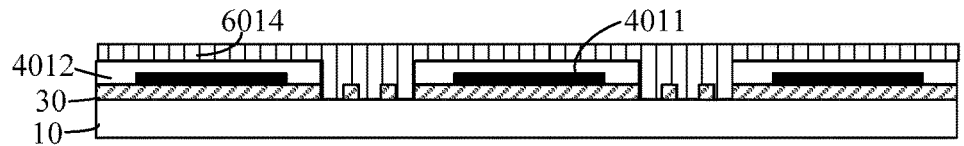
Figure 8K:
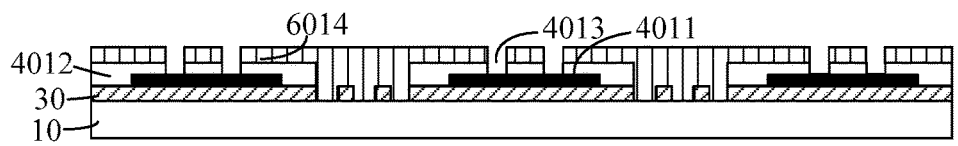
Figure 8L:
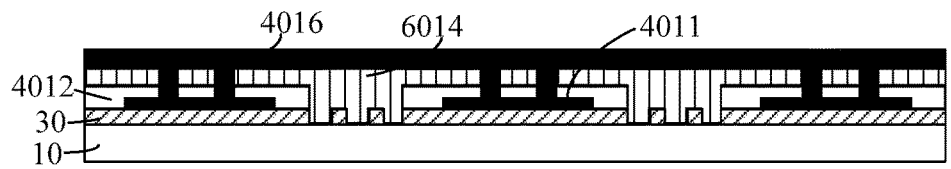
Figure 8M:
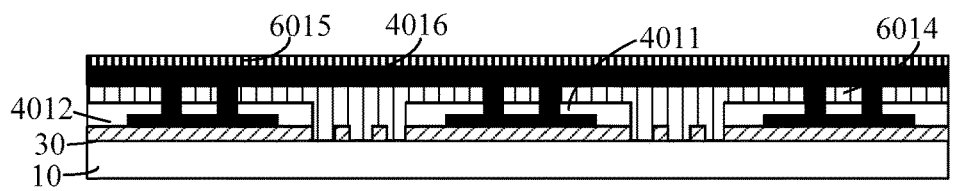
Figure 8N:
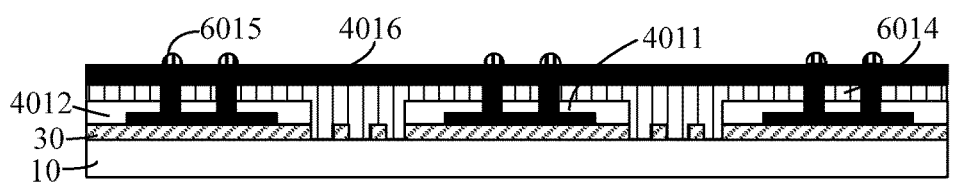
Figure 8O:
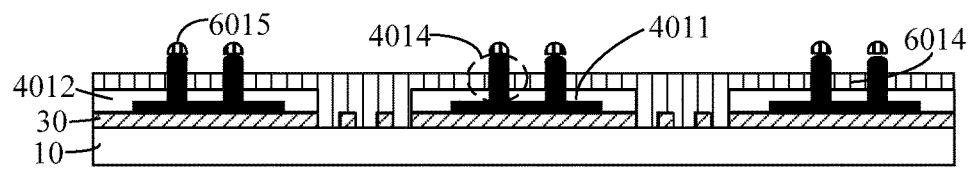
Figure 8P:
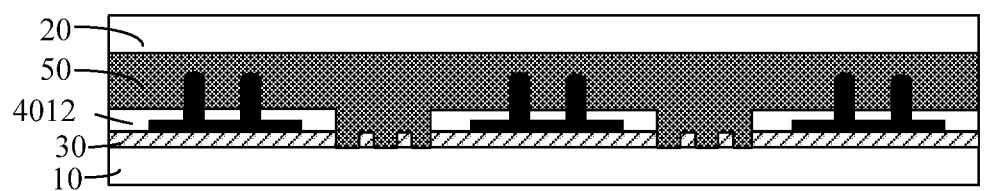

As shown in FIG. 7 and FIGS. 8a-8p, embodiments of the present disclosure provide a method for fabricating a display substrate. By taking the top of the protrusion portions on the flat portion is a curved surface as an example, the method comprises the following steps.

Step S1010, forming the first functional film 30 on a display substrate by deposition.

As shown in FIG. 8a, in step S1010, SiNx and SiO$_2$ can be deposited to a predefined thickness on a display substrate by plasma enhanced chemical vapor deposition (PECVD), forming the first functional film 30.

Step S1011, coating a first photoresist layer 6011 on the first functional film 30, and performing a first exposure and development, to form a pattern comprising recessed regions a and non-recessed regions b on the first photoresist layer 6011.

In Step S1011 shown in FIG. 8b, the first photoresist layer 6011 is coated to cover the first functional film 30 on the display substrate 20, and is exposed with a single gray-scale mask process to form a pattern comprising recessed regions a and non-recessed regions b on the first photoresist layer 6011. By a first development, the first photoresist layer 6011 at a position where the recessed regions a will be formed is removed, and the first photoresist layer 6011 at a position where the non-recessed regions b will be formed is retained.

Step S1012, on the display substrate 20 after the first exposure and development, forming the recessed regions a and the non-recessed regions b on the first functional film 30 by an etching process, and lifting off the first photoresist layer 6011.

In Step S1012 shown in FIG. 8c, the recessed regions a and the non-recessed regions b can be formed by dry etching on the first functional film 30 of the display substrate 20 after the first exposure and development.

Step S1013, forming a first material layer 4015 by deposition on the display substrate 20 on which the first functional film 30 has been formed.

It is noted that, since the flat portion and the protrusion portions on the flat portion are made from the same material, especially a metal, while the flat portion and the protrusion portions on the flat portion are arranged on the first material layer, reference is made herein to a case in which the first material layer is made from Mo.

In Step S1013 shown in FIG. 8*d*, Mo metal can be deposited by PECVD to a predefined thickness on the display substrate 20 after the second exposure and development, forming the first material layer 4015.

Step S1014, coating a second photoresist layer 6012 to cover the second functional film 40, performing a second exposure and development, and forming a pattern comprising the flat portion 4011 on the second photoresist layer 6012 at a position to which the non-recessed regions b of the first functional film 30 correspond.

In Step S1014 shown in FIG. 8*e*, the second photoresist layer 6012 is coated to cover the first material layer 4015 on the display substrate 20, and is exposed with a single gray-scale mask process to form a pattern comprising the flat portion 4011 on the second photoresist layer 6012. The second photoresist layer 6012 at a position where the flat portion 4011 will be formed is retained, and the second photoresist layer 6012 in the remaining region is removed, by a second development.

Step S1015, on the display substrate 20 after the second exposure and development, performing an etching process on the first material layer 4015 to form the flat portion 4011, and lifting off the second photoresist layer 6012.

In Step S1015 shown in FIG. 8*f*, on the display substrate 20 after the second exposure and development, the flat portion 4011 can be formed on the first material layer 4015 by wet etching.

Step S1016, forming a third material layer 4017 by deposition on the display substrate on which the flat portion 4011 has been formed.

In Step S1016 shown in FIG. 8*g*, SiNx and SiO$_2$ can be deposited to a predefined thickness by PECVD on the display substrate to form the third material layer 4017.

Step S1017, coating a third photoresist layer 6013 to cover the third material layer 4017, and performing a third exposure and development, to form a pattern comprising the third functional film 4012 on the third photoresist layer 6013 at a position to which the flat portion 4011 corresponds.

In Step S1017 shown in FIG. 8*h*, the third photoresist layer 6013 is coated to cover the third material layer 4017 on the display substrate 20, and is exposed with a single gray-scale mask process. A pattern comprising the third functional film 4012 is formed on the third photoresist layer 6013. A third development is performed to retain the third photoresist layer 6013 at a position where the third functional film 4012 will be formed, and remove the third photoresist layer 6013 in the remaining region.

Step S1018, forming the third functional film 4012 by an etching process on the display substrate 20 after the third exposure and development, and lifting off the third photoresist layer 6013; wherein the third functional film 4012 covers the flat portion 4011.

In Step S1018 shown in FIG. 8*i*, on the display substrate 20 after the third exposure and development, the third functional film 4012 can be formed by dry etching on the third material layer 4017.

Step S1019, coating a fourth photoresist layer 6014 to cover the third functional film 4012, and performing a fourth exposure and development to form a pattern comprising via holes 4013 on the fourth photoresist layer 6014.

In Step S1019 shown in FIG. 8*j*, the fourth photoresist layer 6014 is coated to cover the third functional film 4012, and is exposed with a single gray-scale mask process, to remove the fourth photoresist layer 6014 at a position where the via holes 4013 will be formed, and retain the fourth photoresist layer 6014 in the remaining region.

Step S1020, on the display substrate 20 after the fourth exposure and development, forming the via holes 4013 by an etching process on the third functional film 4012.

In Step S1020 shown in FIG. 8*k*, on the display substrate 20 after the fourth exposure and development, the via holes 4013 can be formed on the third functional film 4012 by dry etching.

Step S1021, forming a second material layer 4016 on the display substrate 20 on which the via holes 4013 have been formed, wherein the second material layer 4016 is connected with the flat portion 4011 through the via holes 4013.

It is noted that, since the protrusion portions on the flat portion cannot be formed by molding for one time, it is required to form the second material layer to cover via holes in the third functional film, and connect the planarization layer with the flat portion through the via holes. In this way, the protrusion portions on the flat portion can be formed. In view of connection strength of the metal, the material for forming the planarization layer for example is Mo.

In Step S1021 shown in FIG. 8*l*, Mo can be deposited to a predefined thickness by PECVD on the display substrate 20 on which the via holes 4013 have been formed, to form the second material layer 4016.

Step S1022, coating a fifth photoresist layer 6015 to cover the second material layer 4016, and performing a fifth exposure and development, to retain the photoresist of the fifth photoresist layer 6015 to which the protrusion portions 4014 correspond; wherein the photoresist of the fifth photoresist layer 6015 to which the protrusion portions 4014 correspond has a same shape as the top of the protrusion portions 4014.

In Step S1022 shown in FIG. 8*m* and FIG. 8*n*, the fifth photoresist layer 6015 is coated to cover the second material layer 4016, and is exposed with a gray-tone mask, to retain the photoresist of the fifth photoresist layer 6015 at a region where the protrusion portions will be formed, and remove the fifth photoresist layer 6015 in the remaining region remove. The gray-tone mask indicates a line mask with a resolution lower that of an exposure machine, and a portion of a light source is blocked at lines in the mask to obtain the effect of half exposure.

Step S1023, on the display substrate 20 after the fifth exposure and development, form the protrusion portions 4014 on the second material layer 4016 by an etching process, and lifting off the fourth photoresist layer 6014 and the fifth photoresist layer 6015 to form the second functional film 40 comprising the flat portion 4011 and the protrusion portions 4014 on the flat portion 4011.

In Step S1023 shown in FIG. 8*o*, the etching process can be performed by wet etching the second material layer with an etching solution, to form the protrusion portions 4014.

Step S1030, coating the frame sealant 50 on the display substrate 20 resulting from the above steps, and curing the frame sealant 50 with laser, wherein the curved surface reflects the curing light to the frame sealant 50.

In Step S1030 shown in FIG. 8*p*, in case the top of the protrusion portions 4014 is a curved surface, the curved surface of the top of the protrusion portions 4014 can reflect laser light during sealing with laser, so that the frame sealant 50 around the protrusion portions not only receives the laser light in the vertical direction, but also receives laser light reflected by the curved surface. As a result, the frame sealant 50 around the protrusion portions 4014 receives more laser light, i.e., more laser energy. This facilitating melting the frame sealant 50, so that the cured frame sealant 50 strongly bonds the display substrate 10 and the another display substrate 20.

It is noted that reference is made to a case in which the top of the protrusion portions in the protrusion sub-arrays is a curved surface, but embodiments of the present disclosure are not limited in term of the cross-sectional shape of the protrusion portions. In view of practical fabricating process, a same material is used to form the flat portion and the gate, and a same material is used to form the planarization layer and the source. Since the planarization layer and the protrusion portions of the protrusion sub-arrays are made from a same material, the flat portion and the planarization layer can be formed by a same material or different materials. Embodiments of the present disclosure are not limited in term of the material of the flat portion and the planarization layer.

As can be seen from the foregoing, during forming the substrate of the display device, the protrusion array on the flat portion is formed by several processes, the protrusion portions of the protrusion sub-arrays is formed by the second material layer, the via holes in the third functional film connect a bottom portion of the protrusion portions with the flat portion, and the top of the protrusion portions is higher than the third functional film. As a result, during sealing with laser, the frame sealant bonds the display substrate with another display substrate, and the protrusion portions of the protrusion sub-arrays are embedded in the frame sealant since the third functional film has a thickness less than the protrusion portions. When the display substrate is bonded with another display substrate by the frame sealant, although the surface of the third functional film is parallel with the contact surface of the frame sealant, the protrusion portions of the protrusion array are embedded in the frame sealant. This increases an acting force for preventing a displacement between the surface of the third functional film and the contact surface of the frame sealant, and thus increases the fixing effect in the parallel direction. This blocks displacement between the surface of the third functional film and the contact surface of the frame sealant, reduces the possibility of detaching and cracking of the frame sealant due to displacement, and solves the problem of erosion of the display device by water and oxygen due to detaching and cracking of the frame sealant. In addition, since the flat portion is provided with the protrusion array, and by means of the via holes in the third functional film, the protrusion portions on the flat portion are embedded in the frame sealant. As a result, the contact surface area between the surface of the third functional film and the frame sealant increases, which increases the bonding strength between the surface of the third functional film and the frame sealant, and thus increases the bonding strength of the frame sealant between the display substrate and the another display substrate.

Figure 9:
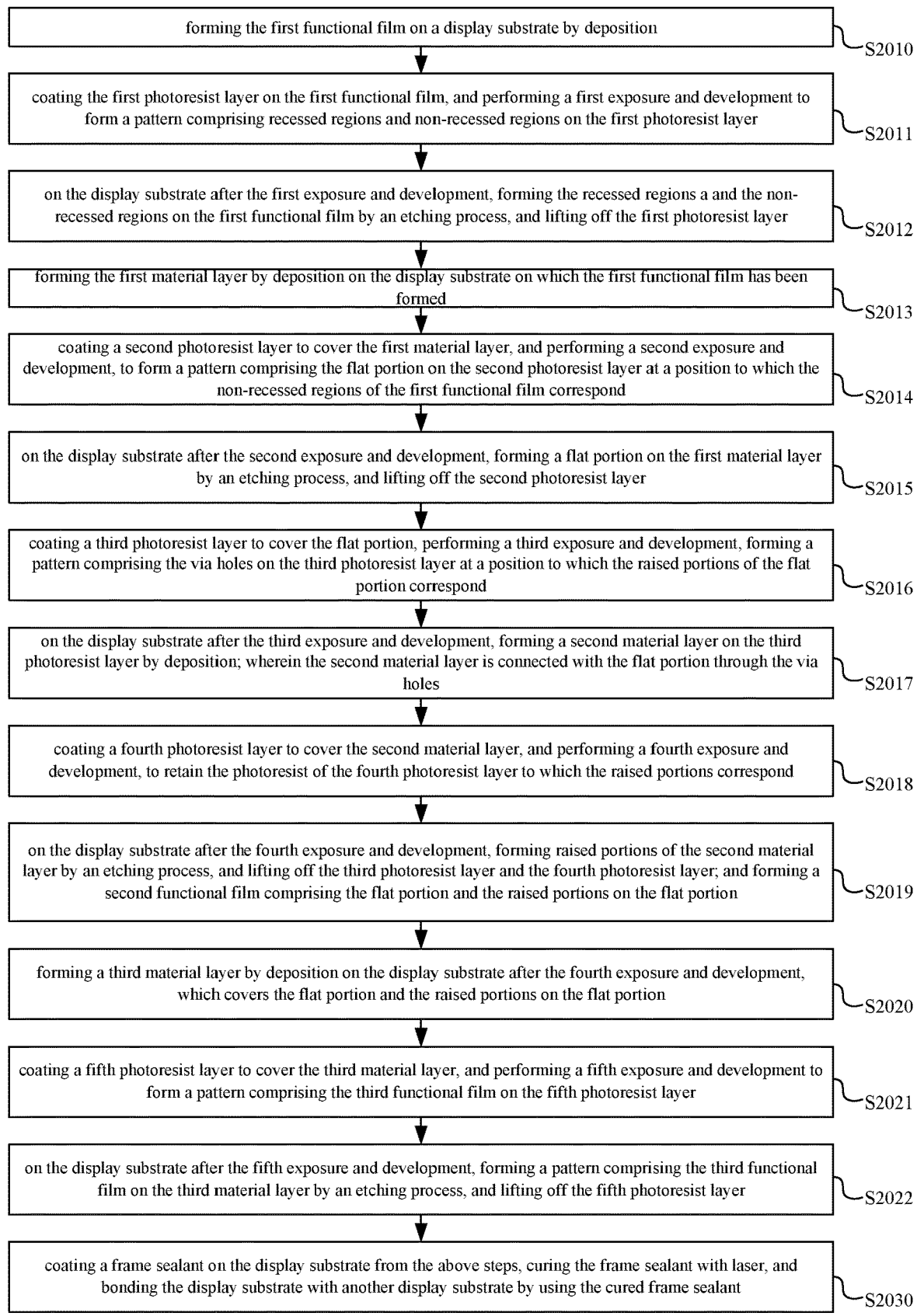
FIG. 9 is a flow chart for illustrating steps in another method of fabricating a display substrate in an embodiment of the present disclosure.
Figure 10A:
FIGS. 10a, 10b, 10c, 10d, 10e, 10f, 10g, 10h, 10i, 10j, 10k, 10l, 10m, 10n, 10o, 10p and 10q are structural views for illustrating a display substrate during another fabricating process in an embodiment of the present disclosure.
Figure 10B:
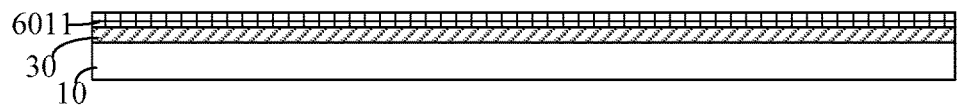
Figure 10C:
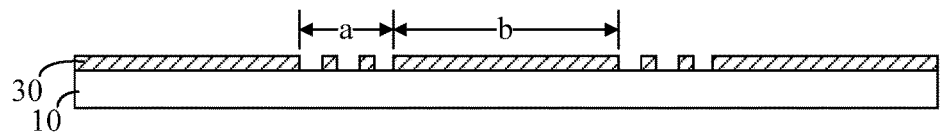
Figure 10D:
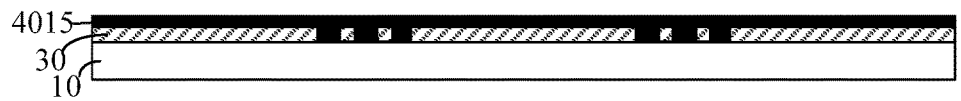
Figure 10E:
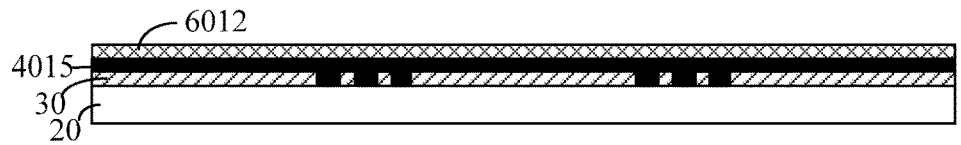
Figure 10F:
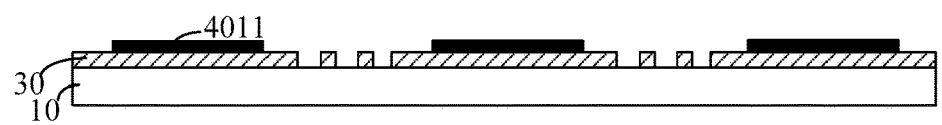
Figure 10G:
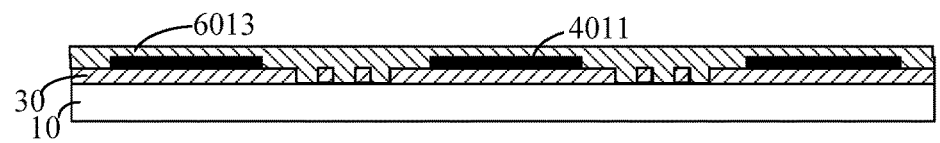
Figure 10H:
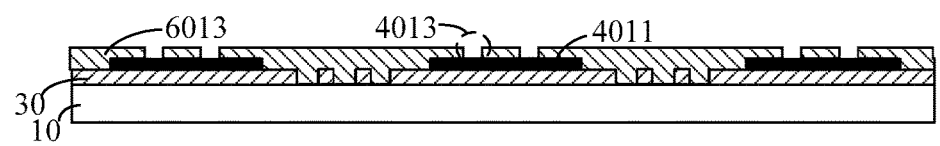
Figure 10I:
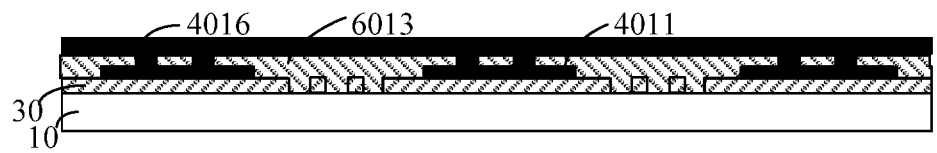
Figure 10J:
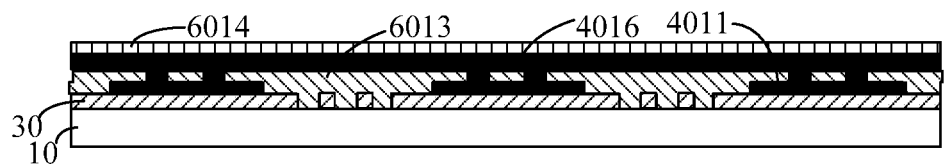
Figure 10K:
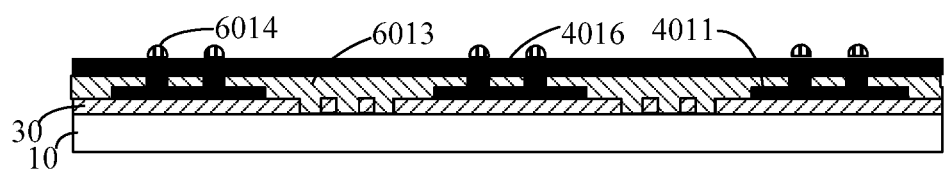
Figure 10L:
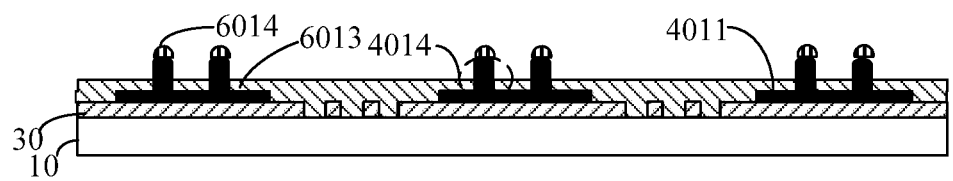
Figure 10M:
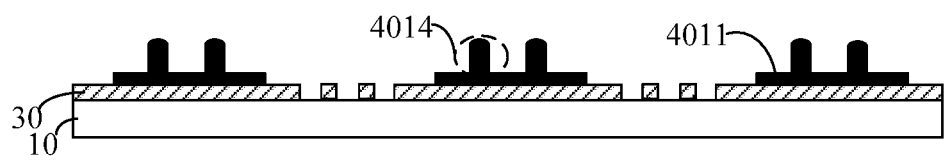
Figure 10N:
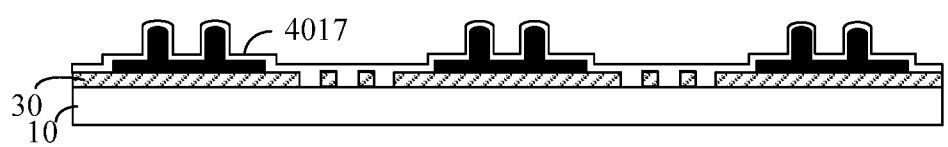
Figure 10O:
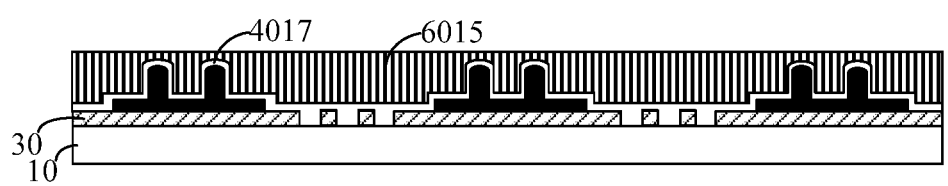
Figure 10P:
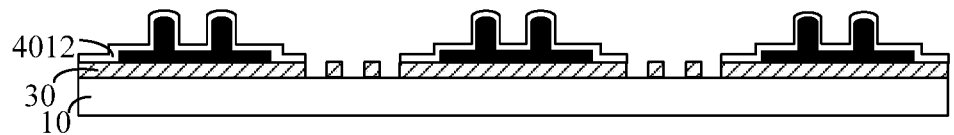
Figure 10Q:
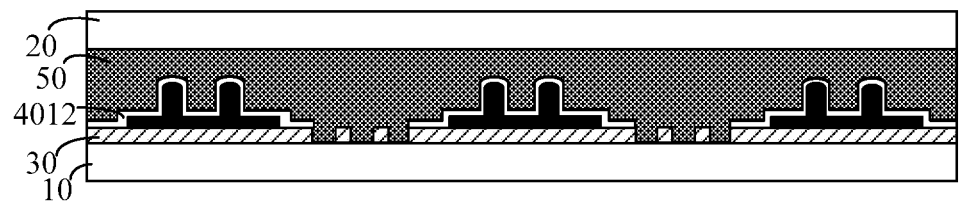

As shown in FIG. 9 and FIGS. 10a-10q, embodiments of the present disclosure provide a method for fabricating a display substrate. By taking the top of the protrusion portions in the protrusion sub-arrays is a curved surface as an example, the method comprises the following steps.

Step S2010, forming the first functional film 30 on a display substrate 30 by deposition.

In Step S2010 shown in FIG. 10a, SiNx and $SiO_2$ can be deposited to a predefined thickness on a display substrate by PECVD, to form the first functional film 30.

Step S2011, coating the first photoresist layer 6011 on the first functional film 30, and performing a first exposure and development to form a pattern comprising recessed regions a and non-recessed regions b on the first photoresist layer 6011.

In Step S2011 shown in FIG. 10b, the first photoresist layer 6011 is coated to cover the first functional film 30 on the display substrate 20, and is exposed with a single gray-scale mask process to form a pattern comprising recessed regions a and non-recessed regions b on the first photoresist layer 6011. By a first development, the first photoresist layer 6011 at a position where the recessed regions a will be formed is removed, and the first photoresist layer 6011 at a position where the non-recessed regions b will be formed is retained.

Step S2012, on the display substrate 20 after the first exposure and development, forming the recessed regions a and the non-recessed regions b on the first functional film 30 by an etching process, and lifting off the first photoresist layer 6011.

In Step S2012 shown in FIG. 10c, on the first functional film 30 of the display substrate 20 after the first exposure and development, the recessed regions a and the non-recessed regions b can be formed by dry etching.

Step S2013, forming the first material layer 4015 by deposition on the display substrate 10 on which the first functional film 30 has been formed.

It is noted that, since the flat portion and the protrusion portions on the flat portion are made from the same material, especially a metal, and the flat portion and the protrusion portions on the flat portion are arranged on the first material layer, reference is made herein to a case in which the first material layer is made from Mo.

In Step S2013 shown in FIG. 10d, on the display substrate 20 after the second exposure and development, Mo can be deposited to a predefined thickness by PECVD to form the first material layer 4015.

Step S2014, coating the second photoresist layer 6012 to cover the first material layer 4015, and performing a second exposure and development, to form a pattern comprising the flat portion 4011 on the second photoresist layer 6012 at a position to which the non-recessed regions b of the first functional film 30 correspond.

In Step S2014 shown in FIG. 10e, the second photoresist layer 6012 is coated on the first material layer 4015, and is exposed with a single gray-scale mask process to retain the second photoresist layer 6012 at a position where the flat portion 4011 will be formed, and remove the second photoresist layer 6012 in the remaining region.

Step S2015, on the display substrate 20 after the second exposure and development, forming the flat portion 4011 on the first material layer 4015 by an etching process, and lifting off the second photoresist layer 6012.

In Step S2015 shown in FIG. 10f, the first material layer 4015 can be etched by wet etching to form the flat portion 4011.

Step S2016, coating the third photoresist layer 6013 to cover the flat portion 4011, performing a third exposure and development, forming a pattern comprising the via holes 4013 on the third photoresist layer 6013 at a position to which the protrusion portions 4014 of the flat portion 4011 correspond.

In Step S2016 shown in FIG. 10g and FIG. 10h, the third photoresist layer 6013 is coated on the flat portion 4011, and exposure is performed with a single gray-scale mask process, to remove the third photoresist layer 6013 at a position where the via holes 4013 will be formed, and retain the third photoresist layer 6013 in the remaining region.

Step S2017, on the display substrate 20 after the third exposure and development, forming the second material layer 4016 on the third photoresist layer 6013 by deposition; wherein the second material layer 4016 is connected with the flat portion 4011 through the via holes 4013.

It is noted that, since the protrusion portions on the flat portion cannot be formed by molding for one time, it is required to form the second material layer to cover via holes in the third photoresist layer, and connect the planarization layer with the flat portion through the via holes. In this way, the protrusion portions on the flat portion can be formed. In view of connection strength of the metal, the material for forming the second material layer for example is Mo.

In Step S2017 shown in FIG. 10*i*, on the display substrate 20 after the third exposure and development, Mo can be deposited to a predefined thickness by PECVD, to form the second material layer 4016.

Step S2018, coating the fourth photoresist layer 6014 to cover the second material layer 4016, and performing a fourth exposure and development, to retain the photoresist of the fourth photoresist layer 6014 to which the protrusion portions 4014 correspond.

In Step S2018 shown in FIG. 10*j* and FIG. 10*k*, the fourth photoresist layer 6014 is coated to cover the second material layer 4016, and an exposure is performed with a gray-tone mask. The photoresist of the fourth photoresist layer 6014 where the protrusion portions 4014 will be formed is retained, and the fourth photoresist layer 6014 in in the remaining region is removed. The retained photoresist of the fourth photoresist layer 6014 to which the protrusion portions 4014 correspond has a same shape as the top of the protrusion portions 4014.

Step S2019, on the display substrate 20 after the fourth exposure and development, forming the protrusion portions 4014 of the second material layer 4016 by an etching process, and lifting off the third photoresist layer 6013 and the fourth photoresist layer 6014; and forming the second functional film 40 comprising the flat portion 4011 and the protrusion portions 4014 on the flat portion 4011.

In Step S2019 shown in FIG. 10*l* and FIG. 10*m*, the second material layer 4016 can be etched by wet etching with an etching solution to form the protrusion portions 4014.

Step S2020, forming the third material layer 4017 by deposition on the display substrate after the fourth exposure and development, which covers the flat portion 4011 and the protrusion portions 4014 on the flat portion 4011.

In Step S2020 shown in FIG. 10*n*, SiNx and $SiO_2$ can be deposited to a predefined thickness by PECVD on the display substrate, to form the third material layer 4017.

Step S2021, coating the fifth photoresist layer 6015 to cover the third material layer 4017, and performing a fifth exposure and development to form a pattern comprising the third functional film 4012 on the fifth photoresist layer 6015.

In Step S2021 shown in FIG. 10*o*, the fifth photoresist layer 6015 is coated on the third material layer 4017, and an exposure is performed with a single gray-scale mask process, to retain the fifth photoresist layer 6015 at a position where a pattern comprising the third functional film 4012 will be formed, and remove the fifth photoresist layer 6015 in the remaining region.

Step S2022, on the display substrate 20 after the fifth exposure and development, forming a pattern comprising the third functional film 4012 on the third material layer 4017 by an etching process, and lifting off the fifth photoresist layer 6015.

In Step S2022 shown in FIG. 10*p*, the third material layer 4017 is etched by dry etching to form the third functional film 4012.

Step S2030, coating the frame sealant 50 on the display substrate 20 from the above steps, curing the frame sealant 50 with laser, and bonding the display substrate 10 with another display substrate 20 by using the cured frame sealant 50.

In Step S2030 shown in FIG. 10*q*, the top of the protrusion portions 4014 is a curved surface, and during curing the frame sealant 50 with laser, the top of protrusions of the protrusion array 4010 which are formed by the third functional film 4012 at positions the third functional film 4012 covers the protrusion portions 4014 is a curved surface, and the laser enters the top of the protrusion portions 4014 through the third functional film 4012. The curved surface of the top of the protrusion portions 4014 is used to reflect the light for curing the frame sealant 50, and this light for curing is formed by the laser which passes through the third functional film 4012 covering the protrusion portions. The display substrate 10 is bonded to another display substrate 20 by the cured frame sealant 50.

In this embodiment, the protrusions which are embedded in the frame sealant are the protrusion portions and the third functional film covering the protrusion portions. The third functional film covers the flat portion and the protrusion portions on the flat portion. The protrusion portions on the flat portion and the third functional film thereon form the protrusion portions of the protrusion array, and the protrusion portions are embedded in the frame sealant. When the display substrate is bonded with another display substrate by the frame sealant, the protrusions are embedded in the frame sealant. This increases an acting force for preventing a displacement between the surface of the third functional film and the contact surface of the third functional film and the frame sealant, thus increases the fixing effect in the parallel direction, and blocks the displacement between the third functional film and the contact surface of the frame sealant. This reduces the possibility of detaching and cracking of the frame sealant due to displacement, and solves the problem of erosion of the display device by water and oxygen due to detaching and cracking of the frame sealant. In addition, the third functional film is provided with the protrusion array on a side, and the protrusion portions of the protrusion array and the third functional film covering the protrusion portions are embedded in the frame sealant. This increases the contact surface area between the surface of the third functional film and the frame sealant, increases the bonding strength between the third functional film surface and the frame sealant, and thus increases the bonding strength of the frame sealant between the display substrate and the another display substrate.

In an embodiment, a display apparatus is provided, which comprises the display substrate as described in any one of the above embodiments.

In addition, the display device can be any product or component with a display function, such as electronic paper, a mobile phone, a tablet computer, a TV set, a monitor, a notebook computer, a digital photo frame, and a navigator.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A display substrate, comprising functional films, wherein at least one of the functional films comprises a protrusion array on a side away from the display substrate, and wherein at least one protrusion portions of the protrusion array are configured to be embedded into a frame sealant between the display substrate and another display substrate, during assembling the display substrate with the another display substrate;
   wherein the protrusion array comprises protrusion sub-arrays, each of the protrusion sub-arrays comprises a flat portion, and the at least one protrusion portions are arranged on the flat portion;
   wherein the functional films comprise a first functional film and a second functional film, the first functional film contacts the display substrate on a side, and contacts a side of the second functional film on the other side, the second functional film comprises the protrusion array on a side away from the display substrate, and the flat portion and the at least one protrusion portions are arranged on the first functional film;
   wherein the functional films further comprise a third functional film, the third functional film covers the flat portion, a thickness of the third functional film is smaller than a thickness of the protrusion portions, the third functional film is provided with at least one via holes, and a top of the at least one protrusion portions passes through the via holes.

2. The display substrate of claim 1, wherein the third functional film comprises a portion which contacts the first functional film.

3. The display substrate of claim 1, wherein at least one of the functional films comprises recessed regions and non-recessed regions, and the protrusion array is located in the non-recessed regions.

4. The display substrate of claim 1, wherein a top of the protrusion portions is a curved surface.

5. The display substrate of claim 1, wherein the flat portion and the at least one protrusion portions comprise a metal.

6. The display substrate of claim 1, wherein the first functional film is a buffer layer comprising SiNx or $SiO_2$.

7. The display substrate of claim 1, wherein the second functional film is a metal layer.

8. The display substrate of claim 1, wherein the third functional film is an insulating layer comprising SiNx or $SiO_2$.

9. A display apparatus, comprising the display substrate of claim 1.

10. A method for fabricating a display substrate comprising functional films, comprising:
    forming at least one of the functional films on a display substrate; and
    forming a protrusion array on a side of at least one of the functional films away from the display substrate, wherein protrusion portions of the protrusion array are configured to be embedded into a frame sealant between the display substrate and another display substrate, during assembling the display substrate with the another display substrate,
    wherein the step of forming the protrusion array on the side of at least one of the functional films away from the display substrate comprises:
      forming a first functional film;
      forming a first material layer by deposition on the display substrate on which the first functional film has been formed;
      coating a second photoresist layer to cover the first material layer, and performing a second exposure and development, to form a pattern comprising the flat portion on the second photoresist layer at a position to which the non-recessed regions of the first functional film correspond;
      etching the display substrate on which the second exposure and development has been performed, to form the flat portion on the first material layer, and lifting off the second photoresist layer;
      forming a third material layer by deposition on the display substrate on which the flat portion has been formed;
      coating a third photoresist layer which covers the third material layer, and performing a third exposure and development, to form a pattern comprising the third functional film on the third photoresist layer at a position to which the flat portion corresponds;
      etching the display substrate on which the third exposure and development has been performed, to form the third functional film, and lifting off the third photoresist layer, wherein the third functional film covers the flat portion;
      coating a fourth photoresist layer which covers the third functional film, and performing a fourth exposure and development, to form a pattern comprising via holes on the fourth photoresist layer;
      etching the display substrate on which the fourth exposure and development has been performed, to form the via holes on the third functional film;
      forming a second material layer on the display substrate on which the via holes have been formed, the second material layer is connected with the flat portion through the via holes;
      coating a fifth photoresist layer which covers the second material layer, and performing a fifth exposure and development, to retain photoresist on the fifth photoresist layer to which the protrusion portions correspond; and
      etching the display substrate on which the fifth exposure and development has been performed, to form the protrusion portions on the second material layer, and lifting off the fourth photoresist layer and the fifth photoresist layer, to form a second functional film which comprises the flat portion and the protrusion portions on the flat portion.

11. The method of claim 10, wherein the photoresist which is retained on the fifth photoresist layer and to which the protrusion portions correspond has a same shape as a top of the protrusion portions.

12. A method for fabricating a display substrate comprising functional films, comprising:
    forming at least one of the functional films on a display substrate; and
    forming a protrusion array on a side of at least one of the functional films away from the display substrate, wherein protrusion portions of the protrusion array are configured to be embedded into a frame sealant between the display substrate and another display substrate, during assembling the display substrate with the another display substrate, wherein the step of forming the protrusion array on the side of at least one of the functional films away from the display substrate comprises:
forming a first functional film;
forming a first material layer by deposition on the display substrate on which the first functional film has been formed;
coating a second photoresist layer which covers the first material layer, and performing a second exposure and development, to form a pattern comprising the flat portion on the second photoresist layer at a position the non-recessed regions of the first functional film correspond;
etching the display substrate on which the second exposure and development has been performed, to form the flat portion on the first material layer, and lifting off the second photoresist layer;
coating a third photoresist layer which covers the flat portion, and performing a third exposure and development, to form a pattern comprising via holes on the third photoresist layer at a position the protrusion portions of the flat portion corresponds;
depositing on the display substrate on which the third exposure and development has been performed, to form a second material layer on the third photoresist layer, wherein the second material layer is connected with the flat portion through the via holes;
coating a fourth photoresist layer which covers the second material layer, and performing a fourth exposure and development, to retain the photoresist on the fourth photoresist layer to which the protrusion portions correspond;
etching the display substrate on which the fourth exposure and development has been performed, to form the protrusion portions on the second material layer, and lifting off the third photoresist layer and the fourth photoresist layer, to form a second functional film which comprises the flat portion and the protrusion portions on the flat portion;
depositing on the display substrate on which the fourth exposure and development has been performed, to form a third material layer which covers the second functional film;
coating a fifth photoresist layer which covers the third material layer, and performing a fifth exposure and development, to form a pattern comprising the third functional film on the fifth photoresist layer; and
etching the display substrate on which the fifth exposure and development has been performed, to form the third functional film on the third material layer, and lifting off the fifth photoresist layer.

13. The method of claim 12, wherein the photoresist which is retained on the fourth photoresist layer and to which the protrusion portions correspond has a same shape as a top of the protrusion portions.

* * * * *